June 25, 1963 D. P. TRILLER 3,095,340

PRECISION RESISTOR MAKING BY RESISTANCE VALVE CONTROL FOR ETCHING

Filed Aug. 21, 1961

INVENTOR.
DAVID P. TRILLER

BY

H. H. Losche

Paul S. Collignon

ATTORNEYS

United States Patent Office
3,095,340
Patented June 25, 1963

3,095,340
PRECISION RESISTOR MAKING BY RESISTANCE VALUE CONTROL FOR ETCHING

David P. Triller, Indianapolis, Ind., assignor to the United States of America as represented by the Secretary of the Navy Filed Aug. 21, 1961, Ser. No. 132,992
2 Claims. (Cl. 156—8)
(Granted under Title 35, U.S. Code (1952), sec. 266)

Figure 1:
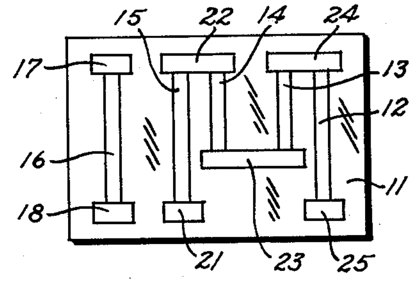

The invention described herein may be manufactured and used by or for the Government of the United States of America for governmental purposes without the payment of any royalties thereon or therefor.

The present invention relates to a method of producing resistors and more particularly to a method of depositing resistor films on glass or ceramic substrates.

There is a constant demand for smaller electrical and electronic components, particularly in the aircraft field, as weight is of extreme importance. One concept of microelectronics which is being presently investigated and which offers a great reduction in size and weight of electronic units is that of integrated circuitry on ceramic substrates. Integrated circuitry includes a number of active and passive components which are fabricated by one or more of a combination of several thin film deposition techniques onto a glass or ceramic substrate.

Resistors, which are the most widely used components in integrated circuitry networks, are fabricated in place on glass or ceramic substrates by various methods. However, the resistance value of a film deposited on glass or ceramic substrates is difficult to control. Many resistance films undergo changes after deposition due to oxidation of the evaporated metal and thus the ultimate resistance cannot be accurately predicted. Also, the microstructure of the surface of a substrate affects the properties of an evaporated film. The degree of roughness of a substrate influences the resistance properties of a film deposited thereon. On a rough surface, flat areas of peaks and valleys receive deposits at normal incidence, while steep sides are coated at oblique angles and thus receive a thinner layer. Hence, the film consists of a network of low and high resistance areas. Since the resistor films oxidize to some extent, the high resistance areas may consist predominantly of an oxide. These oxides have a high negative coefficient of resistance while metals have a positive coefficient. Mixing the two effects may or may not have a desirable influence on the resistance characteristics. In any case, the resulting properties are difficult to predict.

The present invention provides an improved method of making microcircuitry resistors by depositing a monitor strip onto a substrate and then comparing the resistance value of the monitor strip with a predetermined desired value. The difference between the two values, which is error, is fed as an error signal to a servo system which makes a correction to a pattern being projected in order to provide a resistance pattern of desired value.

It is therefore a general object of the present invention to provide an improved method of making a resistor.

Another object of the present invention is to provide an improved method of depositing resistor films on glass and ceramic substrates.

Still another object of the present invention is to provide a monitor resistance strip for correcting a resistance pattern on a substrate.

Figure 3:
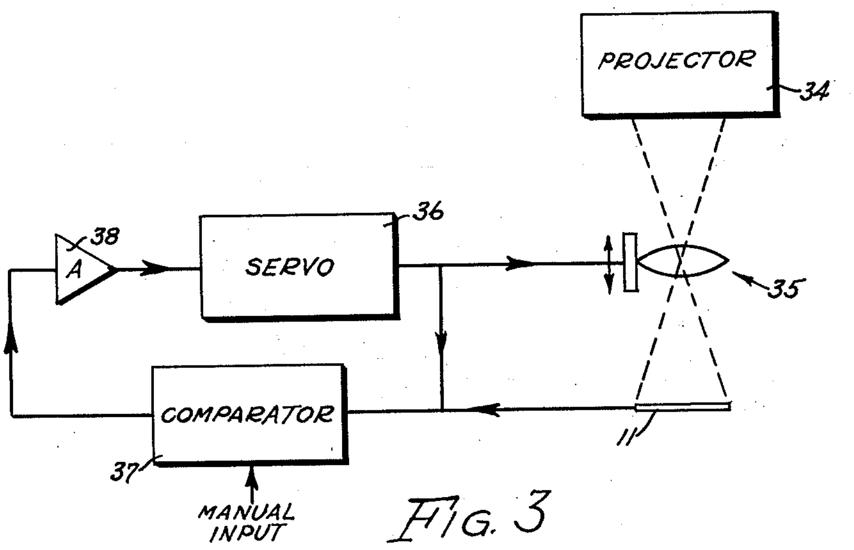

Other objects and advantages of the present invention will be readily appreciated as the same becomes better understood by reference to the following detailed description when considered in connection with the accompanying drawing wherein:

FIGURE 1 is a plan view of a group of resistors on a substrate;

FIGURES 2*a*–2*f* are sectional views of a group of resistors in various stages of manufacture; and FIGURE 3 is a diagrammatic view showing a system for correcting a resistance pattern being projected onto a substrate.

Referring now to the drawing, there is shown in FIGURE 1, a substrate 11, which is of insulating material, such as glass or ceramic material, on which resistors 12 through 15 are deposited thereon. Other active or passive components may be attached or fabricated on the substrate 11. However, as these components form no part of the present invention they are not illustrated on the drawing. A monitor resistance strip 16 is also provided on the substrate 11. The resistors which might be comprised of metals, semiconductors, or alloys, are applied to the substrate 11 by any suitable means such as injection molding, pyrolysis, solid-state reaction, evaporation and sputtering. As shown in the drawing, monitor resistance strip 16 is provided with two end electrodes 17 and 18, and electrodes 21 through 25 are provided for resistors 12 through 15.

In FIGURES 2*a*–2*f*, there is shown the sequence of manufacturing steps used in producing a resistor according to the method of the present invention. The substrate 11 that is used affects the properties of the deposited resistance element, particularly that of an evaporated film. An ideal substrate should have high thermal conductivity, minimum electrical conductivity, low thermal coefficient of expansion, high mechanical strength, and low dielectric constant. Also, the surface should be flat, smooth, and homogeneous. Glass is extensively used as a substrate material for evaporated thin-film microcircuitry. Although glass has relatively low thermal conductivity, it is inexpensive and readily available. Also, glass has the desired flat, smooth surface, and has favorable electrical, chemical, and thermal expansion properties.

Ceramics are also extensively used as substrate. While the dielectric constants of ceramics are not as low as that of glass and the surfaces not as smooth as glass, in general, ceramics excel glass in heat conductivity, mechanical strength and high temperature capabilities. Alumina ($Al_2O_3$), beryllia (BeO), and barium titanate ($BaTiO_3$) are some of the ceramic materials that are presently being used as substrates for microcircuits.

The first step of producing resistors according to this invention consists of depositing a thin film of a metal, a semiconductor, or an alloy onto the substrate 11. The thin film is comprised of two areas, which are designated by numerals 31 and 32 in FIGURE 2*b* of the drawing. Area 31 is used as the resistance element for the monitor resistor 16, shown in FIGURE 1 of the drawing and resistors 12 through 15 are formed from area 32, as will be hereinafter described.

A suitable thin film for microcircuitry should be chemically inert to atmospheric gases, electrically and thermally stable, and relatively free of electrical and thermal noise. In addition, the film should be capable of adhering tenaciously to the substrate and have a coefficient of thermal expansion approximating that of the substrate material. One widely used thin film material is tin oxide which is deposited on a substrate by the hydrolysis of tin chloride. Other widely used materials are tantalum and nickel-chromium.

Figures 2A, 2B, 2C, 2D, 2E, 2F:
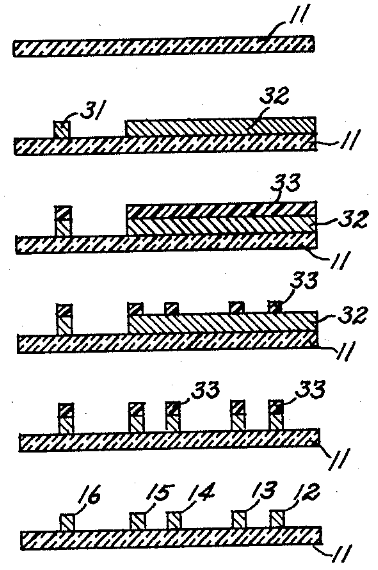

A photosensitive coating 33 is applied over the resistance material, as shown in FIGURE 2*c* of the drawing, and a light pattern is projected onto the photosensitive coating 33 in order to develop, or harden, the coating that covers the area that is to remain as a resistor. Photosensitive coatings and the manner of applying and removing them are well-known in the art, as for example, see U.S. Patent 1,862,231, issued June 7, 1932, to James C. McFarland. As shown in FIGURE 3 of the drawing, projector 34 is provided with an adjustable lens system 35 that can be used to either increase or decrease the size of the pattern being projected onto the photosensitive coating. Adjustable lens systems are well-known in the art, as for example, see page 192 of the text Optical Instruments, Chemical Publishing Co., Inc., 1945. Lens system 35 is operated by servo 36 in response to comparator 37. Comparator 37, which by way of example, might contain a nulling bridge circuit, compares the resistance of the monitor resistance strip with a predetermined desired resistance value which can be set in the comparator 37 by means of a manual input. Any difference between the actual resistance value and the calculated resistance value will be amplified by amplifier 38 and then fed to servo 36 to drive lens system 35 so that the pattern will be changed accordingly to correct for any error due to the non-uniformity of the thin resistor film deposited on the substrate.

In FIGURE 2*d* of the drawing, there is shown the condition of the photosensitive coating 33 after the unexposed portion has been removed, as by rinsing in a suitable solvent, leaving the photosensitive coating 33 covering the areas that are to be resistors. The next step consists of placing the substrate in an etching bath that removes the material not protected by the photosensitive coating 33. FIGURE 2*e* shows the substrate after etching away the unwanted portion of the metallic film and FIGURE 2*f* shows the substrate after the protective photosensitive coating has been removed.

In producing integrated circuitry, the thickness of the thin film to be deposited is first determined, and likewise the length and width of the resistor strips are calculated to give the desired resistance value. A suitable film or screen is made for the projector 34 and the position of lens system 35 is determined to give the desired projected image onto the substrate 11. If the deposited film has the desired resistance per unit area, no change would have to be made in the setting of the lens system.

After the thin film is deposited on the substrate 11, the resistance value of the monitor resistance strip is measured, and the measured value is supplied to the comparator 37 where it is compared with the predetermined resistance value. If the resistance value of the monitor strip is lower than the predetermined resistance value, which by way of example could be caused by an excessive deposit of resistance film, then the comparator 37 would detect the difference and provide an error signal to the servo 36 to lower the lens system 35. Servo 36 also feeds back a signal to comparator 37, as shown in FIGURE 3 of the drawing, to drive comparator 37 to a null position.

Lowering the lens system 35 will reduce the size of the pattern projected onto the substrate 11, which in effect, will ultimately reduce the width of the resistors formed. Likewise, if the resistance value of the monitor strip is higher than the predetermined resistance value, the lens system 35 will be raised on command from the servo 36. Raising the lens system 35 will increase the size of the pattern projected onto the substrate 11, which in effect, will ultimately increase the width of the resistors formed, and thus effectively decrease the resistance value of the resistors.

It can thus be seen that the present invention provides an improved method of making precision resistors for use in integrated circuitry on ceramic substrates.

Obviously many modifications and variations of the present invention are possible in the light of the above teachings. It is therefore to be understood that within the scope of the appended claims, the invention may be practiced otherwise than as specifically described.

What is claimed is:

1. A method of producing precision resistors comprising: depositing a resistance film on first and second areas of an insulated base, then coating at least said second area with a photosensitive material, then comparing the resistance value of said first area with a predetermined resistance value, then projecting a light pattern onto said photosensitive material of a size determined by the resistance value of said first area thereby hardening a portion of said photosensitive material, and then etching the areas of said second area that are not covered by said hardened photosensitive material thereby forming a plurality of precision resistors on said insulated base.

2. A method of producing precision resistors comprising: depositing a resistance film of first and second areas on an insulated base, then coating at least said second area with a photosensitive material, then comparing the resistance value of said first area with a predetermined resistance value to provide an error signal, then applying said error signal to a servo system to translate a lens system, then projecting a light pattern through said lens system onto said photosensitive material thereby hardening a portion of said photosensitive material, and then etching the areas of said second area that are not covered by said hardened photosensitive material thereby forming a plurality of precision resistors on said insulated base.

References Cited in the file of this patent

UNITED STATES PATENTS

| | | |
|---|---|---|
| 2,273,941 | Dorn | Feb. 24, 1942 |
| 2,545,576 | Godley | Mar. 20, 1951 |
| 2,693,023 | Kerridge et al. | Nov. 2, 1954 |
| 2,912,312 | Japel | Nov. 10, 1959 |
| 2,978,364 | Blaustein | Apr. 4, 1961 |